United States Patent
Hikichi et al.

(10) Patent No.: US 9,638,761 B2
(45) Date of Patent: May 2, 2017

(54) MAGNETIC SENSOR CIRCUIT WITH POWER SUPPLY FLUCTUATION DETECTION

(71) Applicant: Seiko Instruments Inc., Chiba-shi, Chiba (JP)

(72) Inventors: Tomoki Hikichi, Chiba (JP); Daisuke Muraoka, Chiba (JP); Minoru Ariyama, Chiba (JP); Kentaro Fukai, Chiba (JP)

(73) Assignee: SII SEMICONDUCTOR CORPORATION, Chiba (JP)

( * ) Notice: Subject to any disclaimer, the term of this patent is extended or adjusted under 35 U.S.C. 154(b) by 144 days.

(21) Appl. No.: 14/518,427

(22) Filed: Oct. 20, 2014

(65) Prior Publication Data
US 2015/0115942 A1   Apr. 30, 2015

(30) Foreign Application Priority Data

Oct. 25, 2013   (JP) .................. 2013-222587

(51) Int. Cl.
| | | |
|---|---|---|
| G01R 33/02 | (2006.01) | |
| G01R 33/00 | (2006.01) | |
| G01R 31/28 | (2006.01) | |
| G01R 19/165 | (2006.01) | |

(52) U.S. Cl.
CPC ..... G01R 33/0017 (2013.01); G01R 31/2829 (2013.01); G01R 19/16538 (2013.01)

(58) Field of Classification Search
None
See application file for complete search history.

(56) References Cited

U.S. PATENT DOCUMENTS

| | | | | |
|---|---|---|---|---|
| 5,351,005 A | * | 9/1994 | Rouse ................... | G01R 17/10 324/207.21 |
| 5,777,550 A | * | 7/1998 | Maltby ................. | G01F 23/284 324/727 |
| 2002/0093446 A1 | * | 7/2002 | Horsley ................ | H02N 1/002 341/157 |
| 2008/0238410 A1 | * | 10/2008 | Charlier ............. | G01R 33/0017 324/202 |
| 2012/0062222 A1 | * | 3/2012 | Watanabe ............ | G01R 33/072 324/251 |

FOREIGN PATENT DOCUMENTS

JP   3-252526 A   11/1991

* cited by examiner

*Primary Examiner* — Patrick Assouad
*Assistant Examiner* — Douglas X Rodriguez
(74) *Attorney, Agent, or Firm* — Brinks Gilson & Lione

(57) ABSTRACT

To provide a magnetic sensor circuit that outputs a desired detection pulse while preventing an erroneous detection/erroneous release pulse output when a fluctuation in a power supply voltage occurs within an operating power supply voltage range. A magnetic sensor circuit is configured to include a detection circuit that detects a fluctuation in a power supply voltage or an internal power supply voltage and so as not to latch a determination output of a comparator by a latch circuit that, on the basis of a power supply fluctuation detection signal output from the detection circuit, holds the logic of a control clock signal output from an oscillation circuit for a prescribed period of time and determines the output logic of an output terminal.

2 Claims, 5 Drawing Sheets

MAGNETIC SENSOR CIRCUIT WITH POWER SUPPLY FLUCTUATION DETECTION

RELATED APPLICATIONS

This application claims priority under 35 U.S.C. §119 to Japanese Patent Application No. 2013-222587 filed on Oct. 25, 2013, the entire content of which is hereby incorporated by reference.

BACKGROUND OF THE INVENTION

Field of the Invention

The present invention relates to a magnetic sensor circuit, and more specifically to a configuration for preventing an erroneous detection and release at the occurrence of a fluctuation in a power supply voltage in a signal processing circuit that performs an offset cancel.

Background Art

A resistance bridge type magnetic sensor typified by a Hall effect switch uses a magnetoelectric transducer having a small magnetoelectric conversion coefficient and a relatively large offset voltage. In order to achieve high magnetic sensitivity precision, a signal processing circuit needs an offset cancel operation based on a clock signal. Further, there is a possibility that since an output signal from a sensor is small, a reference voltage for detecting a prescribed detection magnetic flux density or release magnetic flux density also becomes as small as a few tens of mV, and an erroneous detection or release will be done due to a fluctuation in the output of an amplifier and erroneous determination of a comparator, depending on timing with a reference clock signal having a width of a few V and used in signal processing when a power supply voltage fluctuates.

A related art magnetic sensor circuit has, for example, a voltage regulator incorporated therein and suppresses a fluctuation in a drive voltage in each of a sensor element and a signal processing circuit. Further, for example, the logic of a sensor output is latched plural times in a time-division manner, followed by a coincidence decision or a majority decision to decide an eventual output logic (refer to, for example, Patent Document 1).

CITATION LIST

Patent Document

[Patent Document 1] Japanese Patent Application Laid-Open No. 3-252526

A wide operating power supply voltage range (e.g., 3V to 26V) has recently been required for a magnetic sensor. Besides, the magnetic sensor is used even under such a severe environment that a power supply voltage fluctuates steeply and greatly between a minimum operating voltage and a maximum operating voltage. In such a situation, the width of a fluctuation in an internal power supply voltage of a built-in regulator becomes large. Further, there is a case where an erroneous detection and release cannot be prevented under such a high temperature environment that the sensitivity of a magnetoelectric transducer is reduced to deteriorate an S/N ratio.

In a method of obtaining the logical product of sensor output logics latched plural times, an effective drive speed is reduced by the number of latching times, and adaptation to an application that requires high-speed responses as in a DCBL motor becomes difficult.

SUMMARY OF THE INVENTION

In view of these problems, the present invention provides a magnetic sensor circuit capable of preventing erroneous detection or release of a determination even when a steep fluctuation in a power supply voltage occurs within a wide operating power supply voltage range.

In order to solve the problems in the related art, the magnetic sensor circuit of the present invention is configured as follows.

The magnetic sensor circuit is configured to include a detection circuit that detects a fluctuation in a power supply voltage or an internal power supply voltage and so as not to latch a determination output of a comparison circuit by a latch circuit that on the basis of a power supply fluctuation detection signal output from the detection circuit, holds the logic of a control clock signal output from an oscillation circuit for a prescribed period of time and that determines the output logic of an output terminal.

According to the magnetic sensor circuit of the present invention, it is configured to detect an amount of a transient fluctuation in a power supply voltage or an internal power supply voltage and maintain latch timing of an output logic for a prescribed period. It is therefore possible to provide a magnetic sensor circuit capable of preventing erroneous detection or release of a determination even when a steep fluctuation in a power supply voltage occurs.

DETAILED DESCRIPTION OF THE PREFERRED EMBODIMENTS

First Embodiment

Figure 1:
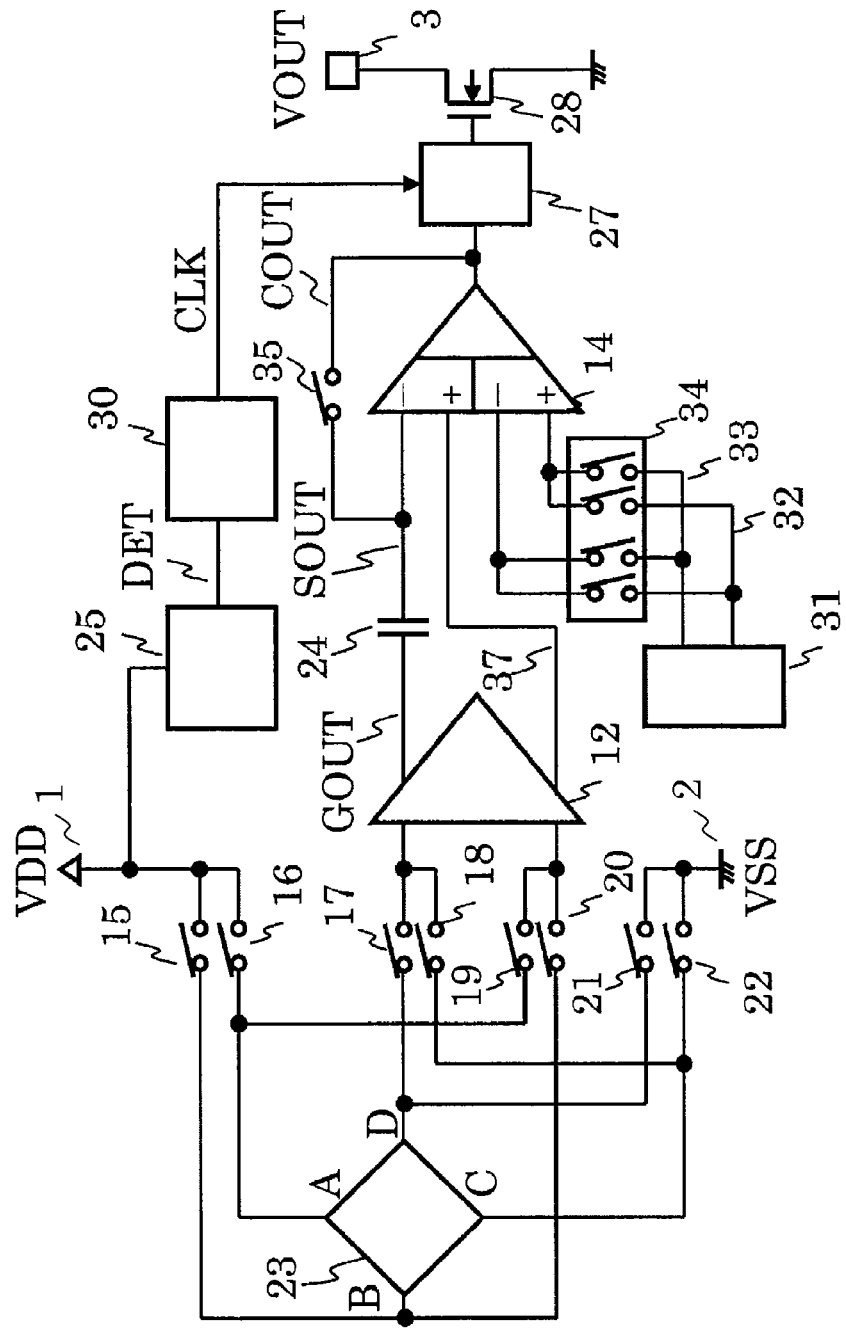
FIG. 1 is a circuit diagram illustrating a magnetic sensor circuit of a first embodiment.

FIG. 1 is a circuit diagram illustrating a magnetic sensor circuit of a first embodiment.

The magnetic sensor circuit of the first embodiment is provided with a magnetoelectric transducer 23, switch groups 15-22 for switching current supply terminals and voltage output terminals of the magnetoelectric transducer 23, an amplifier circuit 12 that amplifies an output signal from the magnetoelectric transducer 23, a sampling capacitor 24 for holding an output voltage GOUT from the amplifier circuit 12 to perform offset canceling, an oscillation circuit 30 that generates a control clock signal CLK, a reference voltage circuit 31 that generates reference voltages 32 and 33 corresponding to a prescribed detection/release magnetic flux density, a comparison circuit 14 for comparing the sampling signal SOUT after offset cancellation held in the sampling capacitor 24, and the reference voltages 32 and 33 generated by the reference voltage circuit 31, a latch circuit 27 for holding a logic signal output from the comparison circuit 14, an output driver 28 for outputting an output signal of the magnetic sensor circuit, based on a logic output from the latch circuit 27, and a power supply fluctuation detecting circuit 25 for detecting a fluctuation in a power supply voltage VDD.

The magnetoelectric transducer 23 has four terminals of A to D represented as four equivalent resistance bridges. When the magnetoelectric transducer 23 applies the power supply voltage VDD to one two terminal pair (A and C or B and D) via the switch group 15-16 and applies a ground voltage VSS thereto via the switch group 21-22 to supply current, the magnetoelectric transducer 23 generates a Hall electromotive force and an offset voltage between the two terminal pair (B and D or A and C) positioned diagonally. The switch groups 15-22 respectively switch the current supply direction to the magnetoelectric transducer 23 and simultaneously switch the detection of voltages from the diagonal terminal pairs. The output voltages from the two terminal pairs positioned diagonally are connected to their corresponding input terminals of the amplifier circuit 12 via the switch groups 17-20. The output voltage GOUT of the amplifier circuit 12 is connected to a one-sided electrode of the sampling capacitor 24. The comparison circuit 14 is configured as a differential/difference amplifier circuit and has a first input terminal pair to which the output voltage of the amplifier circuit 12 is input, and a second input terminal pair to which the voltage of the reference voltage circuit 31 is input. The comparison circuit 14 has a first non-inversion input terminal to which a reference output signal 37 of the amplifier circuit 12 is connected, a first inversion input terminal to which the sampling capacitor 24 is connected, and the second input terminal pair to which the reference voltages 32 and 33 of the reference voltage circuit 31 are input via a switch group 34. A switch 35 is connected between an output terminal of the comparison circuit 14 and the first inversion input terminal thereof. The latch circuit 27 has an input terminal to which the output terminal of the comparison circuit 14 is connected, and an output terminal connected to an input terminal of the output driver 28. Further, a control clock signal CLK is input to a clock input terminal of the latch circuit 27. The power supply fluctuation detecting circuit 25 has an input terminal connected to a power supply terminal 1, and an output terminal connected to an input terminal of the oscillation circuit 30. The oscillation circuit 30 is configured to be capable of controlling the stop and start of oscillation according to a signal output from the power supply fluctuation detecting circuit 25. The output driver 28 is connected between a ground terminal 2 and an output terminal 3.

Figure 4:
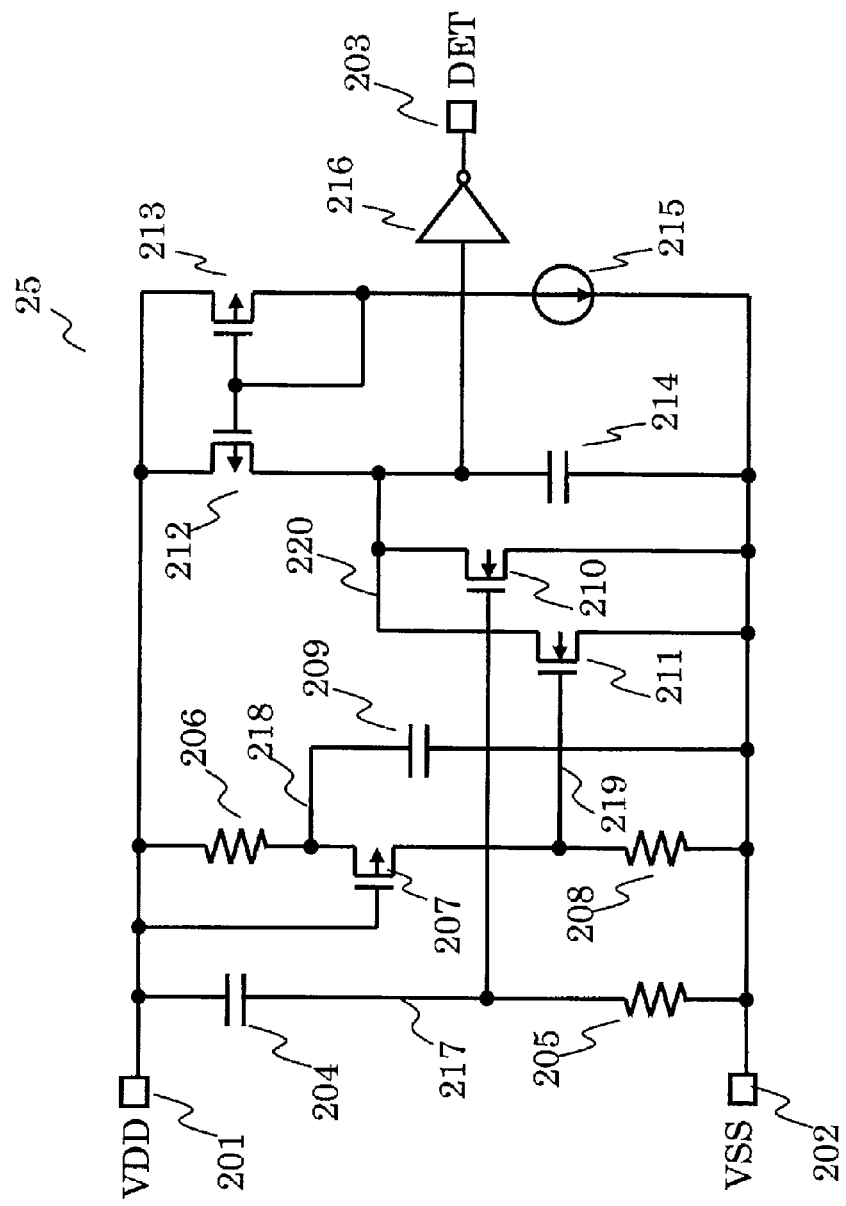
FIG. 4 is a circuit diagram illustrating an example of a power supply fluctuation detecting circuit used in a magnetic sensor circuit of the present invention.

FIG. 4 is a circuit diagram illustrating an example of the power supply fluctuation detecting circuit 25 of the present embodiment. The power supply fluctuation detecting circuit 25 is comprised of a power supply terminal 201, a ground terminal 202, an output terminal 203, capacitors 204, 209 and 214, resistors 205, 206 and 208, transistors 207, 210, 211, 212 and 213, a constant current source 215, and an inverter circuit 216. The transistors 212 and 213 constitute a current mirror circuit.

The operation of the power supply fluctuation detecting circuit 25 will now be described. When a power supply voltage VDD is constant, the transistors 207 and the transistors 210 and 211 are respectively OFF. Since the capacitor 214 is charged to the power supply voltage VDD, the inverter circuit 216 outputs a signal DET of "L" logic.

Next, since a differentiation circuit formed by the capacitor 204 and the resistor 205 raises the voltage of a node 217 when the power supply voltage VDD rises steeply, the transistor 210 is turned on momentarily. Since the electric charge of the capacitor 214 is discharged through the transistor 210, the inverter circuit 216 outputs a signal DET of "H" logic. Thereafter, the capacitor 214 is charged by current of the constant current source 215 through the current mirror circuit so that an input voltage 220 rises. After a prescribed period of time has elapsed, the inverter circuit 216 returns to the output of the "L" logic.

Next, when the power supply voltage falls down steeply, an integration circuit formed by the resistor 206 and the capacitor 209 delays a fluctuation in a source voltage of the transistor 207 while a gate voltage of the transistor 207 is equal to the power supply voltage. Thus, since the transistor 207 is turned on to allow current to flow in the resistor 208, the transistor 211 is turned on momentarily. Since the electric charge of the capacitor 214 is discharged through the transistor 210, the inverter circuit 216 outputs a signal DET of "H" logic. Thereafter, the capacitor 214 is charged by current of the constant current source 215 through the current mirror circuit so that the input voltage 220 rises. After a prescribed period of time has elapsed, the inverter circuit 216 returns to the output of the "L" logic.

As described above, the power supply fluctuation detecting circuit 25 detects the rising and falling of the power supply voltage VDD and outputs the signal DET of the "H" logic corresponding to the time determined by the current value of the constant current source 215 and the capacitance value of the capacitor 214.

When the signal DET of the "H" logic is input from the power supply fluctuation detecting circuit 25, the oscillation circuit 30 maintains a state of the output voltage of the control clock signal CLK for that period.

The latch circuit 27 holds the logic signal output from the comparison circuit 14 at the rising edge of the control clock signal CLK.

A description will next be made about the operation of the magnetic sensor circuit of the first embodiment.

When the power supply voltage VDD does not fluctuate, the respective switch groups 15-22 and 34-35 are ON-OFF operated in a predetermined cycle, and the magnetic sensor circuit performs the normal operation of magnetism determination. During a period in which the control clock signal CLK is "H", the switch 35 is turned on so that the comparison circuit 14 operates as a voltage follower. Then, the comparison circuit 14 samples a voltage including its own offset voltage and offset voltages of the magnetoelectric transducer 23 and the amplifier circuit 12 to the sampling capacitor 24. During a period in which the control clock signal CLK is "L", the switch 35 is turned off so that the comparison circuit 14 performs the operation of comparing a signal voltage proportional to the applied magnetic flux density after the cancellation of the offset voltage, and a differential reference voltage expressed by a difference between the reference voltages 32 and 33.

Now consider where a magnetic flux density exceeding a predetermined level is applied. When the sampling signal SOUT exceeds the differential reference voltage 32-33 of the reference voltage circuit 31, the output voltage COUT of the comparison circuit 14 is inverted during the period in which the control clock signal CLK is "H", and held by the latch circuit 27 at the rising edge of the control clock signal CLK. Thus, the output driver 28 outputs an output signal VOUT indicative of the detection of magnetism. Further, when a magnetic flux density that falls below the predetermined level is applied, the sampling signal SOUT falls below the differential reference voltage 32-33 of the reference voltage circuit 31, so that the output voltage COUT of the comparison circuit 14 is inverted during the period in which the control clock signal CLK is "H", and held in the latch circuit 27 at the rising edge of the control clock signal CLK at the end of the "H" period of the control clock signal CLK. Thus, the output driver 28 outputs an output signal VOUT indicative of non-detection of magnetism during the next once cycle of the control clock signal CLK.

A description will next be made about the operation of the magnetic sensor circuit where the power supply voltage VDD fluctuates.

When the power supply voltage VDD fluctuates, the output voltage GOUT of the amplifier circuit 12 varies by coupling via the parasitic capacitance of an output transistor of the amplifier circuit 12 and is returned to a prescribed normal value after a prescribed period. Here, the power supply fluctuation detecting circuit 25 outputs a signal DET of "H" logic when detecting the fluctuation in the power supply voltage VDD. While the signal DET of "H" logic is being input, the oscillation circuit 30 stops its oscillation operation. With the stop of the oscillation operation by the oscillation circuit 30, the comparison circuit 14 continues operating for a period taken until the output voltage GOUT of the amplifier circuit 12 returns to the predetermined normal value corresponding to the applied magnetic flux density, and the latch circuit 27 does not perform the operation of holding input data. Then, when the oscillation circuit 30 starts an oscillation operation to output the control clock signal CLK after a prescribed period of time has elapsed, the normal output voltage COUT of the comparison circuit 14 is latched in the latch circuit 27 so that a proper output signal VOUT can be outputted.

As described above, the magnetic sensor circuit of the first embodiment is capable of preventing an erroneous output due to the fluctuation in the power supply voltage VDD.

Second Embodiment

Figure 2:
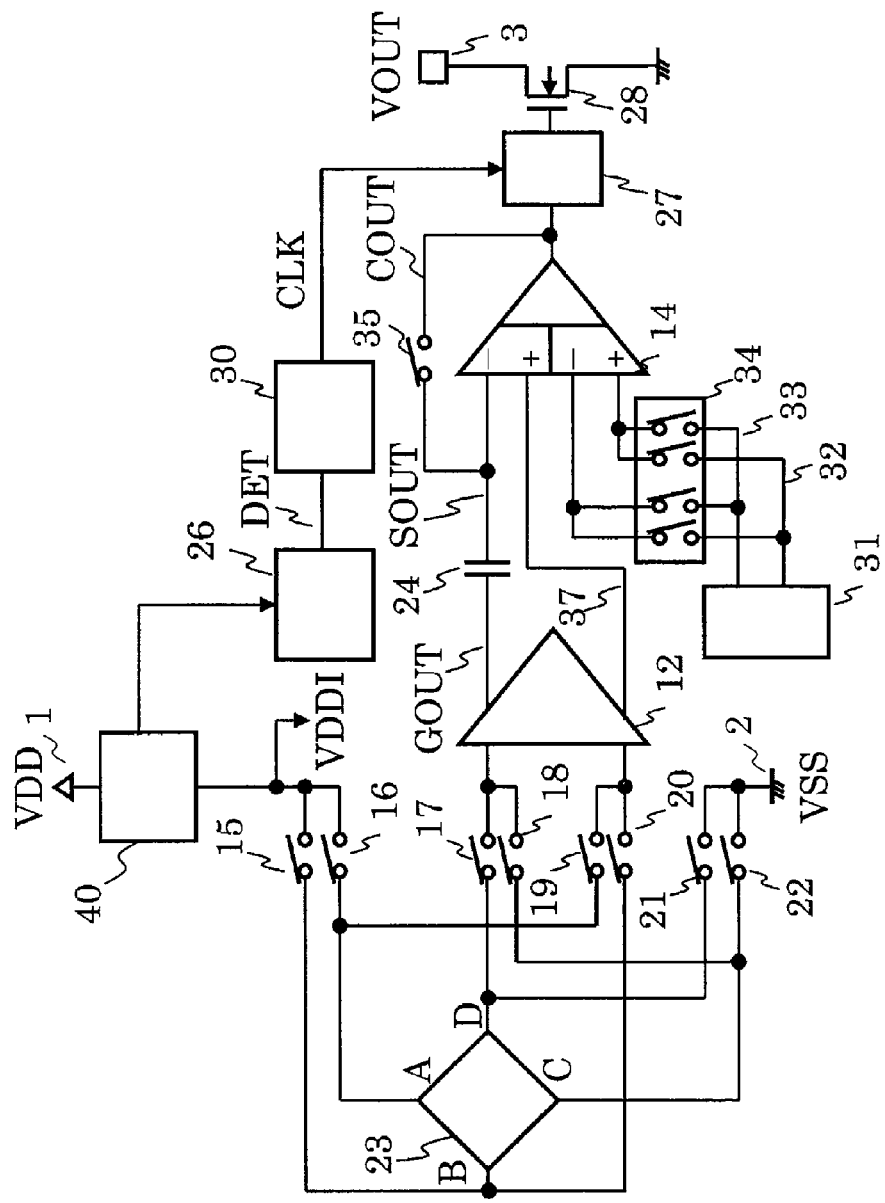
FIG. 2 is a circuit diagram illustrating a magnetic sensor circuit of a second embodiment.

FIG. 2 is a circuit diagram illustrating a magnetic sensor circuit of a second embodiment.

A difference from the magnetic sensor circuit of the first embodiment resides in that a voltage regulator 40 and an internal power supply fluctuation detecting circuit 26 that monitors a voltage from the voltage regulator 40 are provided. Although not illustrated in the drawing, in the present configuration, an internal power supply voltage VDDI is input to a power supply terminal of the circuit except for the voltage regulator 40.

Figure 5:
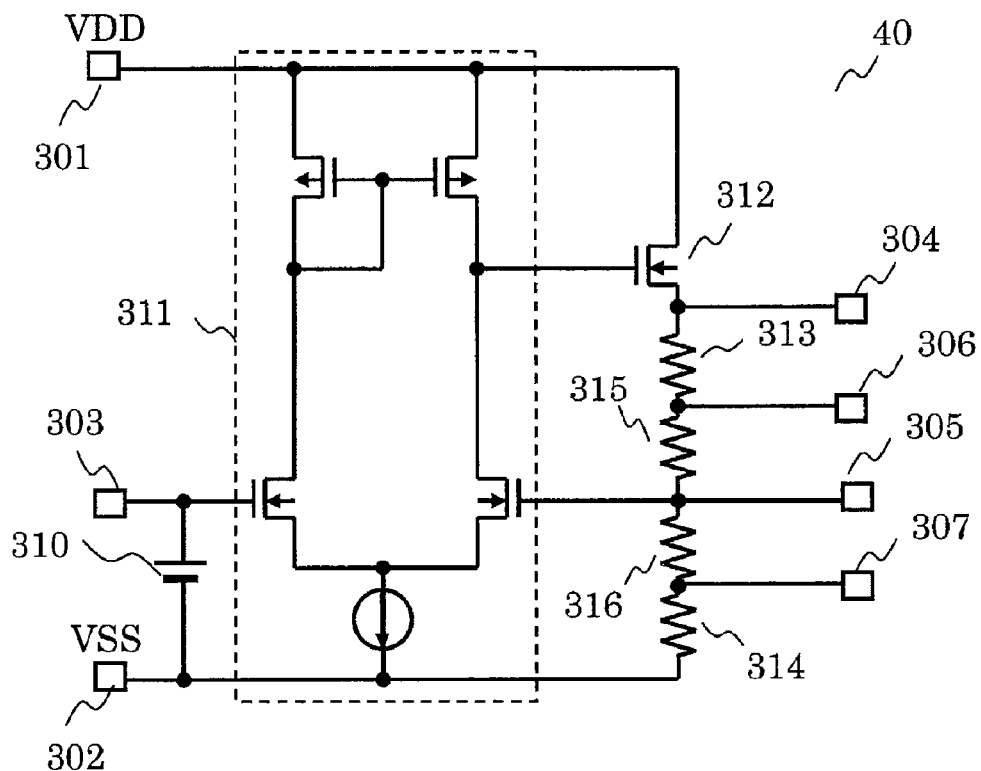
FIG. 5 is a circuit diagram illustrating an example of a voltage regulator used in the magnetic sensor circuit of the present invention.

FIG. 5 is a circuit diagram illustrating an example of the voltage regulator 40. The voltage regulator 40 is configured as a positive phase amplifier by a power supply terminal 301, a ground terminal 302, terminals 304 to 307, a reference voltage circuit 310, an error amplifier 311, a driver 312, and resistance voltage dividing circuits 313 to 316 for generating feedback signals. The power supply terminal 301 is inputted with a power supply voltage VDD. The ground terminal 302 is inputted with a ground voltage VSS. A reference voltage is output from a terminal 303. Further, the voltages of the resistance voltage dividing circuits 313 to 316 are output from the terminals 304 to 307 respectively.

Figure 6:
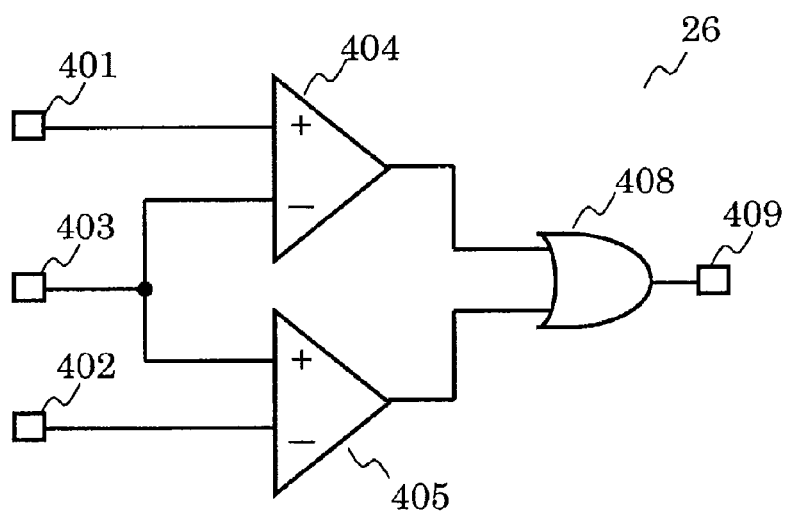
FIG. 6 is a circuit diagram illustrating an example of an internal power supply fluctuation detecting circuit used in the magnetic sensor circuit of the present invention.

FIG. 6 is a circuit diagram illustrating an example of the internal power supply fluctuation detecting circuit 26.

The internal power supply fluctuation detecting circuit 26 is comprised of input terminals 401 to 403, comparison circuits 404 and 405, an OR gate circuit 408 and an output terminal 409.

In the comparison circuit 404, the input terminal 401 is connected to a non-inversion input terminal thereof, and the input terminal 403 is connected to an inversion input terminal thereof. In the comparison circuit 405, the input terminal 403 is connected to a non-inversion input terminal thereof, and the input terminal 402 is connected to an inversion input terminal thereof. In the OR gate circuit 408, output terminals of the comparison circuits 404 and 405 are connected to input terminals thereof, and the output terminal 409 is connected to an output terminal thereof.

The input terminal 403 is connected with the terminal 303 and inputted with the reference voltage. The input terminals 401 and 402 are connected with any of the terminals 304 to 307 and inputted with any of the feedback voltages. For example, the input terminal 401 is connected with the terminal 307, and the input terminal 402 is connected with the terminal 306.

A description will next be made about the operation of the magnetic sensor circuit of the second embodiment.

When the power supply voltage VDD rises suddenly, the feedback voltage rises with an increase in the internal power supply voltage of the terminal 304. When the feedback voltage on the low side of the terminal 307 exceeds the reference voltage, the comparison circuit 404 outputs a signal of "H" logic. Further, when the power supply voltage drops suddenly, the feedback voltage is lowered with a decrease in the internal power supply voltage. When the feedback voltage on the high side of the terminal 306 falls below the reference voltage, the comparison circuit 405 outputs a signal of "H" logic. Thus, with respect to the fluctuation in the power supply voltage, either the comparison circuit 404 or the comparison circuit 405 outputs the signal of "H" logic to the output terminal 409 through the OR circuit 408 as a signal DET. Accordingly, the oscillation circuit 30 is capable of performing an operation similar to the first embodiment.

Incidentally, the pulse width of the signal DET may be a fixed time capable of sufficiently covering the time required for the output voltage GOUT of the amplifier circuit 12 to be restored, a fixed time capable of sufficiently covering the time taken to restore the internal power supply voltage generated by the voltage regulator 40, or a time set according to a fluctuation width of the internal power supply voltage and the rate of change in power supply fluctuation.

Further, only a power supply voltage fluctuation of a single positive or negative polarity assumed in an application may be detected using only either one of the comparison circuits 404 and 405.

Furthermore, the voltage regulator 40 and the internal power supply fluctuation detecting circuit 26 are one example of the circuit configuration shown in the present embodiment, but not limited to it. It has been shown that the prevention of an erroneous output can be realized by detecting the fluctuation in the internal power supply voltage where the voltage regulator is used.

Third Embodiment

Figure 3:
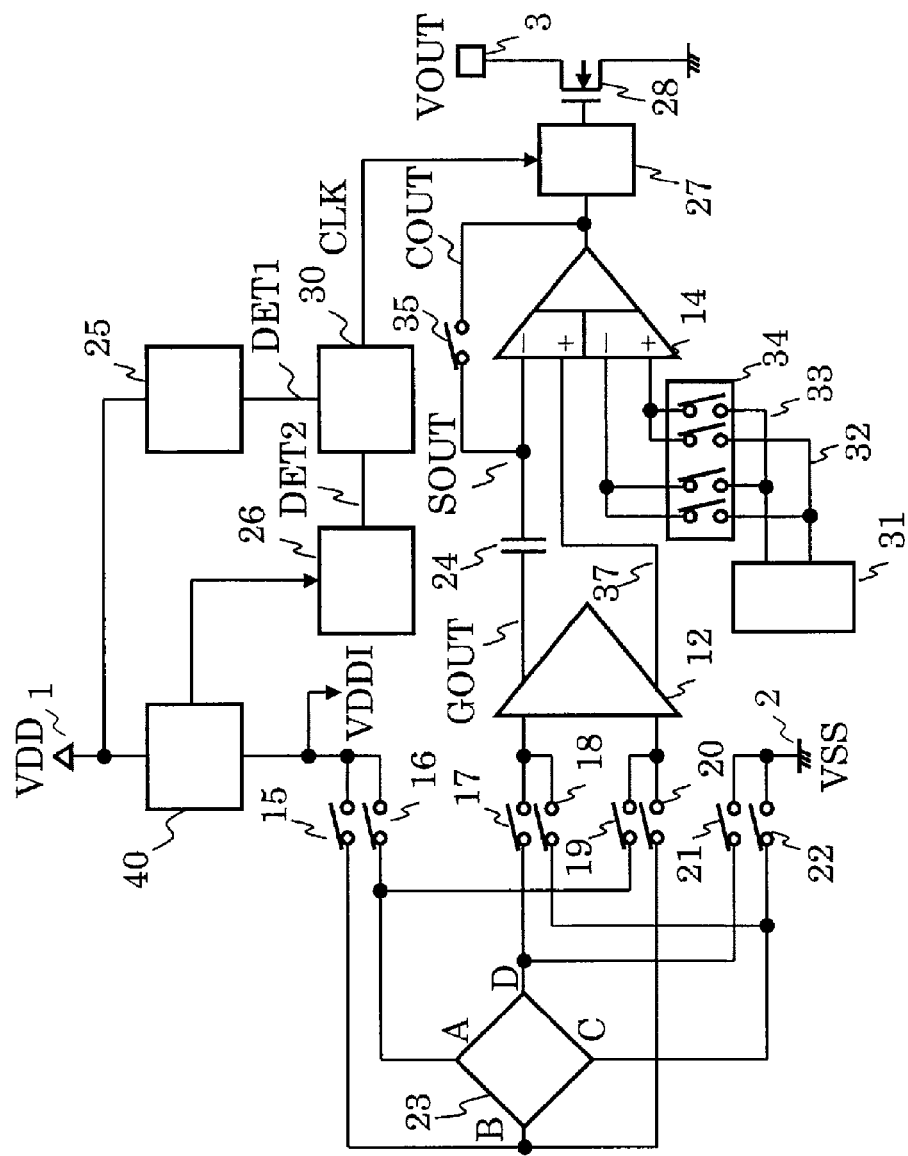
FIG. 3 is a circuit diagram illustrating a magnetic sensor circuit of a third embodiment.

FIG. 3 is a circuit diagram illustrating a magnetic sensor circuit of a third embodiment.

The magnetic sensor circuit of the third embodiment is equipped with a power supply fluctuation detecting circuit 25, a voltage regulator 40 and an internal power supply fluctuation detecting circuit 26.

The magnetic sensor circuit of the third embodiment is capable of causing the power supply fluctuation detecting circuit 25 and the internal power supply fluctuation detecting circuit 26 to complement each other even when either one of them functions poorly due to a random defect or variations in characteristic, and more reliably preventing an erroneous detection/erroneous release pulse output. Even when a fluctuation in the internal power supply voltage relative to a fluctuation in the power supply voltage is large due to manufacturing variations of the voltage regulator 40, the internal power supply fluctuation detecting circuit 26 is capable of more reliably preventing an erroneous detection/erroneous release pulse output.

Incidentally, while the magnetic sensor circuit of the present invention has been described while showing the concrete circuit examples, the present invention is not necessarily limited to the configurations of the examples and switch control timing. The present invention can be modified in various ways within the scope not departing from the claims, For example, in the voltage regulator 40, the error amplifier may be a multistage amplifier, and the driver for internal power supply voltage drive may be a PMOS driver.

Also, the amplifier 12 may be configured as an instrumentation amplifier that obtains amplified outputs from output terminals on both sides thereof.

Further, the comparison circuit 14 may adopt a configuration suitable for a signal processing sequence that performs an offset cancel by repeating a sampling period and a comparison period, but is not limited to this configuration.

Furthermore, while one configuration example of the power supply fluctuation detecting circuit 25 and the internal power supply fluctuation detecting circuit 26 has been shown, they may adopt another circuit configuration that performs a similar detecting operation.

What is claimed is:

1. A magnetic sensor circuit, comprising:
a magnetoelectric transducer;
a switch group configured to switch a current supply terminal pair and a voltage output terminal pair of the magnetoelectric transducer;
an amplifier circuit configured to amplify a voltage output from the magnetoelectric transducer, said voltage being obtained through the switch group;
at least one sampling capacitor configured to hold the output voltage of the amplifier circuit to perform an offset cancellation operation;
an oscillation circuit configured to generate a control clock signal;
a reference voltage circuit configured to generate a reference voltage used in magnetism determination, corresponding to a prescribed applied magnetic flux density;
a comparison circuit having a first inversion input connected to the sampling capacitor and a switch connected between an output terminal and the first inversion input of the comparison circuit, and configured to compare and determining the size relationship between a voltage proportional to an applied magnetic flux density after offset cancellation, said voltage being held in the sampling capacitor, and the reference voltage generated by the reference voltage circuit depending upon an open or closed configuration of the switch;
a latch circuit configured to hold an output signal of the comparison circuit, based on the control clock signal;
an output terminal configured to output an output signal of the magnetic sensor circuit to the outside, based on an output logic of the latch circuit; and
a power supply fluctuation detecting circuit configured to detect that an amount of fluctuation in a power supply voltage exceeds a prescribed amount, and outputs a detection signal,
wherein the oscillation circuit stops an oscillation operation by the detection signal output from the power supply fluctuation detecting circuit during a prescribed period and maintains an output voltage of the control clock signal for a predetermined period of time to thereby fix the output logic of the latch circuit.

2. A magnetic sensor circuit, comprising:
a magnetoelectric transducer;
a switch group configured to switch a current supply terminal pair and a voltage output terminal pair of the magnetoelectric transducer;
an amplifier circuit configured to amplify a voltage output from the magnetoelectric transducer, said voltage being obtained through the switch group;
at least one sampling capacitor configured to hold the output voltage of the amplifier circuit to perform an offset cancellation operation;
an oscillation circuit configured to generate a control clock signal;
a reference voltage circuit configured to generate a reference voltage used in magnetism determination, corresponding to a prescribed applied magnetic flux density;
a comparison circuit configured to compare and determining the size relationship between a voltage proportional to an applied magnetic flux density after offset cancellation, said voltage being held in the sampling capacitor, and the reference voltage generated by the reference voltage circuit;
a latch circuit configured to hold an output signal of the comparison circuit, based on the control clock signal;
an output terminal configured to output an output signal of the magnetic sensor circuit to the outside, based on an output logic of the latch circuit; and
a voltage regulator connected between the magnetoelectric transducer and an internal power supply fluctuation detecting circuit, the voltage regulator configured to supply an internal power supply voltage, and
the internal power supply fluctuation detecting circuit configured to detect that an amount of fluctuation in the internal power supply voltage exceeds a prescribed amount, and outputs a detection signal,
wherein the oscillation circuit stops an oscillation operation by the detection signal output from the internal power supply fluctuation detecting circuit during a prescribed period and maintains an output voltage of the control clock signal for a prescribed period of time to thereby fix the output logic of the latch circuit.

* * * * *